(12) United States Patent
Fan et al.

(10) Patent No.: US 7,915,181 B2
(45) Date of Patent: Mar. 29, 2011

(54) REPAIR AND RESTORATION OF DAMAGED DIELECTRIC MATERIALS AND FILMS

(75) Inventors: Wenya Fan, Campbell, CA (US); Victor Lu, Santa Cruz, CA (US); Michael Thomas, Milpitas, CA (US); Brian Daniels, La Honda, CA (US); Tiffany Nguyen, San Jose, CA (US); De-Ling Zhou, Sunnyvale, CA (US); Ananth Naman, San Jose, CA (US); Lei Jin, San Jose, CA (US); Anil Bhanap, Milpitas, CA (US)

(73) Assignee: Honeywell International Inc., Morristown, NJ (US)

( * ) Notice: Subject to any disclaimer, the term of this patent is extended or adjusted under 35 U.S.C. 154(b) by 917 days.

(21) Appl. No.: 10/543,347

(22) PCT Filed: Jan. 26, 2004

(86) PCT No.: PCT/US2004/002252
§ 371 (c)(1),
(2), (4) Date: Feb. 28, 2006

(87) PCT Pub. No.: WO2004/068555
PCT Pub. Date: Aug. 12, 2004

(65) Prior Publication Data
US 2006/0141641 A1 Jun. 29, 2006

Related U.S. Application Data

(60) Provisional application No. 60/442,479, filed on Jan. 25, 2003.

(51) Int. Cl.
*H01L 21/31* (2006.01)
(52) U.S. Cl. .......... 438/783; 438/99; 438/780; 438/789; 438/790
(58) Field of Classification Search .................... 438/99, 438/780, 783, 789, 790
See application file for complete search history.

(56) References Cited

U.S. PATENT DOCUMENTS 4,567,221 A   1/1986   Maruyama et al. ........... 524/436
(Continued)

FOREIGN PATENT DOCUMENTS

CN   1345464 A   4/2002
(Continued)

OTHER PUBLICATIONS

Patent Abstracts of Japan, vol. 2003, No. 9, Sep. 3, 2003 -& JP 2003 142476 A (Asahi Kasei Corp), May 16, 2003 Hexamethylcyclosilizane as agent par. 79 abstract.
(Continued)

*Primary Examiner* — N Drew Richards
*Assistant Examiner* — Jae Lee

(57) ABSTRACT

Methods of repairing voids in a material are described herein that include: a) providing a material having a plurality of reactive silanol groups; b) providing at least one reactive surface modification agent; and c) chemically capping at least some of the plurality of reactive silanol groups with the at least one of the reactive surface modification agents. Methods of carbon restoration in a material are also described that include: a) providing a carbon-deficient material having a plurality of reactive silanol groups; b) providing at least one reactive surface modification agent; and c)chemically capping at least some of the plurality of reactive silanol groups with the at least one of the reactive surface modification agents. In addition, methods are described herein for reducing the condensation of a film and/or a carbon-deficient film that include: a) providing a film having a plurality of reactive silanol groups; b) placing the film into a plasma chamber; c) introducing a plurality of reactive organic moieties-containing silanes into the chamber; and d) allowing the silanes to react with at least some of the reactive silanol groups. Dielectric materials and low-k dielectric materials are described herein that comprise: a) an inorganic material having a plurality of silicon atoms; and b) a plurality of organic moiety-containing silane compounds, wherein the silane compounds are coupled to the inorganic material through at least some of the silicon atoms.

26 Claims, 1 Drawing Sheet

U.S. PATENT DOCUMENTS

| | | | |
|---|---|---|---|
| 4,624,739 A | 11/1986 | Nixon et al. | 438/723 |
| 4,654,269 A | 3/1987 | Lehrer | 428/428 |
| 5,079,300 A | 1/1992 | Dubrow et al. | 525/106 |
| 5,271,777 A * | 12/1993 | Duffy | 148/537 |
| 5,372,851 A | 12/1994 | Ogawa et al. | 427/255.7 |
| 5,429,730 A | 7/1995 | Nakamura et al. | 204/192.34 |
| 5,479,727 A | 1/1996 | Fine et al. | 34/516 |
| 5,576,247 A | 11/1996 | Yano et al. | 438/760 |
| 5,609,629 A | 3/1997 | Fearnot et al. | 623/1.42 |
| 5,686,549 A | 11/1997 | Grainger et al. | 528/25 |
| 5,750,610 A | 5/1998 | Burns et al. | 524/434 |
| 5,915,175 A | 6/1999 | Wise | 438/238 |
| 6,037,275 A | 3/2000 | Wu et al. | 438/780 |
| 6,042,994 A | 3/2000 | Yang et al. | 430/296 |
| 6,090,724 A | 7/2000 | Shelton et al. | |
| 6,096,070 A | 8/2000 | Ragheb et al. | 623/1.39 |
| 6,177,143 B1 | 1/2001 | Treadwell et al. | 427/543 |
| 6,208,014 B1 | 3/2001 | Wu et al. | 257/629 |
| 6,255,230 B1 | 7/2001 | Ikakura et al. | 438/765 |
| 6,258,972 B1 | 7/2001 | Nakaoka et al. | 556/482 |
| 6,318,124 B1 | 11/2001 | Rutherford et al. | 65/60.8 |
| 6,346,490 B1 | 2/2002 | Catabay et al. | 438/795 |
| 6,395,651 B1 | 5/2002 | Smith et al. | |
| 6,410,149 B1 | 6/2002 | Hendricks et al. | 428/447 |
| 6,420,193 B1 | 7/2002 | Martin | 438/4 |
| 6,441,489 B1 | 8/2002 | Motoyama | |
| 6,448,331 B1 | 9/2002 | Ioka et al. | |
| 6,451,512 B1 | 9/2002 | Rangarajan | 430/313 |
| 6,479,374 B1 | 11/2002 | Ioka et al. | 438/601 |
| 6,495,906 B2 | 12/2002 | Smith et al. | 257/629 |
| 6,508,920 B1 | 1/2003 | Ritzdorf et al. | 204/194 |
| 6,518,205 B1 | 2/2003 | Wu et al. | 438/782 |
| 6,521,547 B1 | 2/2003 | Chang et al. | 438/781 |
| 6,537,919 B1 | 3/2003 | Wang | 438/710 |
| 6,566,283 B1 | 5/2003 | Pangrle et al. | 438/788 |
| 6,573,147 B2 | 6/2003 | Moon et al. | 438/348 |
| 6,583,067 B2 | 6/2003 | Chang et al. | 438/723 |
| 6,589,889 B2 | 7/2003 | Endisch et al. | 438/740 |
| 6,607,925 B1 | 8/2003 | Kim et al. | 438/4 |
| 6,713,382 B1 * | 3/2004 | Pangrle et al. | 438/622 |
| 6,743,737 B2 | 6/2004 | Yau et al. | 438/758 |
| 6,762,066 B2 | 7/2004 | Holz | 438/4 |
| 6,770,572 B1 * | 8/2004 | Wu et al. | 438/778 |
| 6,821,680 B1 | 11/2004 | Tao et al. | 438/618 |
| 7,029,826 B2 | 4/2006 | Hacker et al. | 430/311 |
| 2002/0001973 A1 * | 1/2002 | Wu et al. | 438/780 |
| 2002/0168876 A1 | 11/2002 | Endisch et al. | |
| 2003/0003765 A1 | 1/2003 | Gibson et al. | |
| 2003/0013211 A1 | 1/2003 | Hu et al. | 438/4 |
| 2003/0198895 A1 | 10/2003 | Toma et al. | 430/314 |
| 2004/0013858 A1 | 1/2004 | Hacker et al. | 428/195.1 |
| 2004/0072436 A1 | 4/2004 | RamachandraRao et al. | 438/692 |
| 2004/0079632 A1 * | 4/2004 | Ahmad et al. | 204/192.3 |
| 2004/0096593 A1 | 5/2004 | Lukas et al. | 427/558 |
| 2004/0096672 A1 | 5/2004 | Lukas et al. | 428/446 |
| 2004/0152296 A1 | 8/2004 | Matz et al. | 428/623 |
| 2004/0224095 A1 | 11/2004 | Miller | 427/402 |
| 2004/0224512 A1 | 11/2004 | Sato et al. | 438/689 |
| 2005/0017365 A1 | 1/2005 | RamachandraRao et al. | 257/758 |
| 2005/0032293 A1 | 2/2005 | Clark et al. | 438/222 |
| 2005/0077597 A1 | 4/2005 | Toma et al. | 257/629 |
| 2005/0095840 A1 | 5/2005 | Bhanap et al. | 438/623 |
| 2005/0106384 A1 | 5/2005 | Sambasivan et al. | 428/337 |
| 2005/0106762 A1 | 5/2005 | Chakrapani et al. | |
| 2005/0158884 A1 | 7/2005 | Gaynor | 438/4 |
| 2005/0173803 A1 | 8/2005 | Lu et al. | 257/759 |
| 2005/0215072 A1 | 9/2005 | Kevwitch et al. | 438/778 |
| 2005/0229947 A1 | 10/2005 | Spiegelman et al. | 134/2 |
| 2005/0233583 A1 | 10/2005 | Miyajima | 438/672 |
| 2005/0282401 A1 | 12/2005 | Davis | 438/780 |
| 2006/0057837 A1 | 3/2006 | Bhanap et al. | 438/623 |
| 2006/0057855 A1 | 3/2006 | Ramos et al. | 438/710 |
| 2006/0141641 A1 | 6/2006 | Fan et al. | 438/4 |

FOREIGN PATENT DOCUMENTS

| | | |
|---|---|---|
| DE | 10130824 | 10/2002 |
| EP | 0643421 | 3/1995 |
| EP | 0688052 | 12/1995 |
| EP | 0775669 | 5/1997 |
| EP | 0 849 796 | 6/1998 |
| EP | 0997497 | 10/2004 |
| JP | H05-161844 | 6/1993 |
| JP | 06-067408 | 3/1994 |
| JP | 07-335758 | 12/1995 |
| JP | 09-099056 | 4/1997 |
| JP | 09-106983 | 4/1997 |
| JP | 09-237833 | 9/1997 |
| JP | 2000-277520 | 6/2000 |
| JP | 2002-353308 | 6/2002 |
| KR | 2001-0001970 | 4/2002 |
| RU | 2089499 | 9/1997 |
| TW | 483099 | 4/2002 |
| TW | 495880 | 7/2002 |
| WO | WO 9738355 | 10/1997 |
| WO | WO 99/03926 | 1/1999 |
| WO | WO 99/52136 | 10/1999 |
| WO | WO 00/44036 A | 7/2000 |
| WO | WO 02/01621 A | 1/2002 |
| WO | WO 0201621 | 1/2002 |
| WO | WO 03/077296 A | 9/2003 |
| WO | WO 2004068555 | 8/2004 |
| WO | WO 2005/010972 A | 2/2005 |
| WO | WO 2005/034194 A | 4/2005 |
| WO | WO 2005/038863 | 4/2005 |

OTHER PUBLICATIONS

Abell, T. et. al.: "Damage minimized plasma pore sealing of microporous low k dielectrics" Microelectronic Engineering, Elsevier Publishers Bv., Amsterdam, NL, vol. 76, No. 1-4, Oct. 2004, pp. 16-19, XP004565763, ISSN: 0167-9317, the whole document.

"Fabrication of Moisture-Desensitized Freestanding Structures from InP for Photonic-MEMS Applications." Shah, Mithilesh A., et al. Journal of the Electrochemical Society, vol. 153, Issue 1, pp. G7-G11 (2006).

"Observation of intrusion rates of hexamethyldisilazane during supercritical carbon dioxide functionalization of triethoxyfluorosilane low-k films." Capani, P. M., et al., Materials Research Society Symposium Proceedings (2005), 863(Materials, Technology and Reliability of Advanced Interconnects—2005), pp. 177-182.

"Dielectric and Mechanical Properties of Surface Modified Organosilicate Films." Yu, Suzhu, et al., Journal of Sol-Gel Science and Technology (2005), 35(1), pp. 69-75.

"Repair of porous MSW (p-MSQ) films using monochlorosilanes dissolved in supercritical CO2." Xie, Bo, et al., Diffusion and Defect Data—Solid State Data, Pt. B: Solid State Phenomena (2005), 103-104(Ultra Clean Processing of Silicon Surfaces VII), pp. 323-326.

"Non-damaging cleaning processes for porous low-k materials." Clark, Philip G., et al. Advanced Metallization Conference 2004, Proceedings of the Conference, San Diego, (2005), 487-491. Publisher: Materials Research Society.

"The reaction of octyldinnethylchlorosilane and supercritical CO2 mixtures with porous methylsilsesquioxane thin films." Xie, Bo, et al., Advanced Metallization Conference 2004, Proceedings of the Conference, San Diego, (2005), 475-479. Publisher: Materials Research Society, Warrendale, Pa.

"Organic-Functionalized Pure-Silica-Zeolite MFI Low-k Films." Li, Shuang, et al. Chemistry of Materials (2005), 17(7), pp. 1851-1854.

"Repair of porous methylsilsesquioxane films using supercritical carbon dioxide." Xie, Bo, et al. Materials Research Society Symposium Proceedings (2004), 812 (Materials, Technology and Reliability for Advanced Interconnects and Low-k Dielectrics-2004), pp. 13-18.

"Rapid repair of plasma ash damage in low-k dielectrics using supercritical CO2." Gorman, B. P., et al., Journal of Vacuum Science & Technology, B: Microelectronics and Nanometer Structures—Processing, Measurement, and Phenomena (2004), 22(3), pp. 1210-1212.

"Water removal and repair of porous ultra low-k films using supercritical CO2." Xie, Bo, et al., Proceedings—Electrochemical Society (2004), 2003-26(Cleaning Technology in Semiconductor Device Manufacturing VIII), pp. 279-288.

"Backend Processing Using Supercritical CO2." Muscat, Anthony. University of Arizona. May 15, 2003. NSF/SRC Engineering Research Center for Environmentally Benign Semiconductor Manufacturing.

"Cleaning and Restoring k Value of Porous MSQ Films." Clark, Philip G., et al., Semiconductor International, (2003), 26(9), 46-48,50,52.

"Supercritical Carbon Dioxide-based Fluids Used as a Recovery Tool for Low-k Materials." Orozco-Teran, Rosa A., et al., Materials Research Society Symp. Proc. vol. 766. 2003. p. 297-302.

"Effects of Supercritical Processing on Ultra Low-K Films." Reidy, R.F., et al., Advanced Metallization Conference, ed. B.M. Melnick, T.S. Cale, S. Zaima, T. Ohta, 2002. p. 602-606.

"Eliminating dielectric degradation of low-k organosilicate glass by trimethylchlorosilane treatment." Chang, T. C., et al., Journal of Vacuum Science & Technology, B: Microelectronics and Nanometer Structures (2002), 20(4), pp. 1561-1566.

"Effective repair to ultra-low-k dielectric material (k.apprx.2.0) by hexamethyldisilazane treatment." Mor, Y. S., et al., Journal of Vacuum Science & Technology, B: Microelectronics and Nanometer Structures (2002), 20(4), pp. 1334-1338.

"Recovering Dielectric Loss of Low Dielectric Constant Organic Siloxane during the Photoresist Removal Process." Chang, T. C., et al., Journal of the Electrochemical Society (2002), 149(8), pp. F81-F84.

P. Liu, et al., "Enhancing the Oxygen Plasma Resistance of Low-k Methylsilsesquioxane by $H_2$ Plasma Treatment," *Japanese Journal of Applied Physics*, vol. 38, p. 3482-3486 (1999).

Q. Han, et al., "Enabling Low-k Material Integration Through Low-ion Plasma Dry Strip Processes," *Micro Magazine*, p. 51-63 (Oct. 1999).

Zielinski, E. M., et al., "Damascene Integration of Copper and Ultra-Low-k Xerogel for High Performance Interconnects", *IEEE IEDM Tech. Digest*, Dec. 1997, pp. 936-938 (1997).

Office Action mailed Feb. 4, 2009 for related U.S. Appl. No. 10/940,682 which is a continuation-inpart of the present application, pp. 1-11.

* cited by examiner

REPAIR AND RESTORATION OF DAMAGED DIELECTRIC MATERIALS AND FILMS

CROSS-REFERENCE TO RELATED APPLICATION

This application claims the benefit of PCT patent application PCT/US2004/02252 filed on Jan. 26, 2004, which claims the benefit of U.S. provisional patent application 60/442,479 filed on Jan. 25, 2003. This application also claims the benefit of U.S. provisional patent application 60/442,479.

FIELD OF THE INVENTION

The present invention relates generally to semiconductor devices, and in particular, to semiconductor devices having a dielectric or inorganic material therein.

BACKGROUND OF THE INVENTION

To meet the requirements for faster performance, the characteristic dimensions of features of integrated circuit devices have continued to be decreased. Manufacturing of devices with smaller feature sizes introduces new challenges in many of the processes conventionally used in semiconductor fabrication.

As a result of the size decrease in these products, the components that comprise the products must also become smaller and/or thinner. Examples of some of those components that need to be reduced in size or scaled down are microelectronic chip interconnections, semiconductor chip components, resistors, capacitors, printed circuit or wiring boards, wiring, keyboards, touch pads, and chip packaging.

When electronic and semiconductor components are reduced in size or scaled down, any defects that are present in the larger components are going to be exaggerated in the scaled down components. Thus, the defects that are present or could be present in the larger component should be identified and corrected, before the component is scaled down for the smaller electronic products. As feature sizes in integrated circuits are reduced to below about 0.15 µm in future generations of devices, problems such as RC delays and signal-crosstalk will become a dominant problem.

In order to identify and correct defects in electronic, semiconductor and communications components, the components, the materials used and the manufacturing processes for making those components should be broken down and analyzed. Electronic, semiconductor and communication/data-exchange components are composed, in some cases, of layers and films of materials, such as metals, metal alloys, dielectric layers, ceramics, inorganic materials, polymers, or organo-metallic materials.

One of the viable solutions to overcome the problems with integrated circuits mentioned before is to use low dielectric constant (k) materials with dielectric constants of less than about 3 for interlevel (ILD) and intermetal (IMD) dielectric applications. One of the major roadblocks is the mechanical strength of a—low dielectric constant (k) silicon-containing materials. Typically, mechanical strength is proportional to the density of such material. However, the density does not change for a given chemical composition at a given dielectric constant. In this case, the strength of the nanoporous silica is maximized by having the highest degree of cross-linking.

Single level metal patterned wafers with inorganic dielectrics showed voids between the copper lines. These voids form because of the material needing to rearrange itself due to chemical changes that make it less capable of handling the stress placed upon it by the surrounding metals. The voids are by nature unpredictable in size and shape and are dictated by the amount of stress placed upon the dielectric space as well as the inherent flaws within that space. These voids are undesirable because they are unpredicatable and will degrade yield and reliability of the circuit.

U.S. Pat. No. 6,208,014, which is commonly owned and assigned to Honeywell International Inc and also which is incorporated herein in its entirety, teaches a film formation process wherein a silica dielectric film is reacted with a multifinctional surface modification agent. This patent teaches that the nanoporous silica film may be prepared on a substrate immediately prior to the treatment or may be previously prepared and stored or obtained from another source. The patent also teaches that the film may be aged, e.g., further cross-linking/condensation, prior to modification. However, the patent does not teach the voiding problem or that such surface modification treatment may be used on an integrated film.

Therefore, it would be ideal to a) identify potential causes of voiding; b) developing methods and compositions to repair identified voiding or "pre-voiding"; and c) utilize conventional compositions and methods that do not increase the cost or complexity of the semiconductor production process that taken alone or in combination would be desirable to advance the production of layered materials, electronic components and semiconductor components. There is also a need to develop either new materials with enhanced and improved properties, such as 1) lower porosity at similar dielectric constants and 2) contains organic moieties that are more resilient to the integration process conditions; or a process that could help to "repair" the damage done to the films by reintroducing carbon-moieties and to "restore" the properties of low—k dielectric films.

SUMMARY OF THE INVENTION

Methods of pre-treatment of film preventing the formation of voids in a material are described herein that include: a) providing a material having a plurality of reactive silanol groups; b) providing at least one reactive surface modification agent; and c) chemically capping at least some of the plurality of reactive silanol groups with the at least one of the reactive surface modification agents. Methods of carbon restoration in a material are also described that include: a) providing a carbon-deficient material having a plurality of reactive silanol groups; b) providing at least one reactive surface modification agent; and c) chemically capping at least some of the plurality of reactive silanol groups with the at least one of the reactive surface modification agents.

In addition, methods are described herein for reducing the condensation of a film that include: a) providing a film having a plurality of reactive silanol groups; b) placing the film into a plasma chamber; c) introducing a plurality of reactive organic moieties-containing silanes into the chamber; and d) allowing the silanes to react with at least some of the reactive silanol groups. Methods of reducing condensation of a carbon-deficient film are described herein that include: a) providing a carbon-deficient film having a plurality of reactive silanol groups; b) placing the film into a plasma chamber; c) introducing a plurality of reactive organic moieties-containing silanes into the chamber; and d) allowing the silanes to react with at least some of the reactive silanol groups.

Dielectric materials are described herein that comprise: a) an inorganic material having a plurality of silicon atoms; and b) a plurality of organic moiety-containing silane compounds, wherein the silane compounds are coupled to the inorganic material through at least some of the silicon atoms. Dielectric materials are also described herein that comprise: a) a low-k dielectric material having a plurality of silicon atoms; and b) a plurality of organic moiety-containing silane compounds, wherein the silane compounds are coupled to the material through at least some of the silicon atoms.

DETAILED DESCRIPTION

Figure 1:
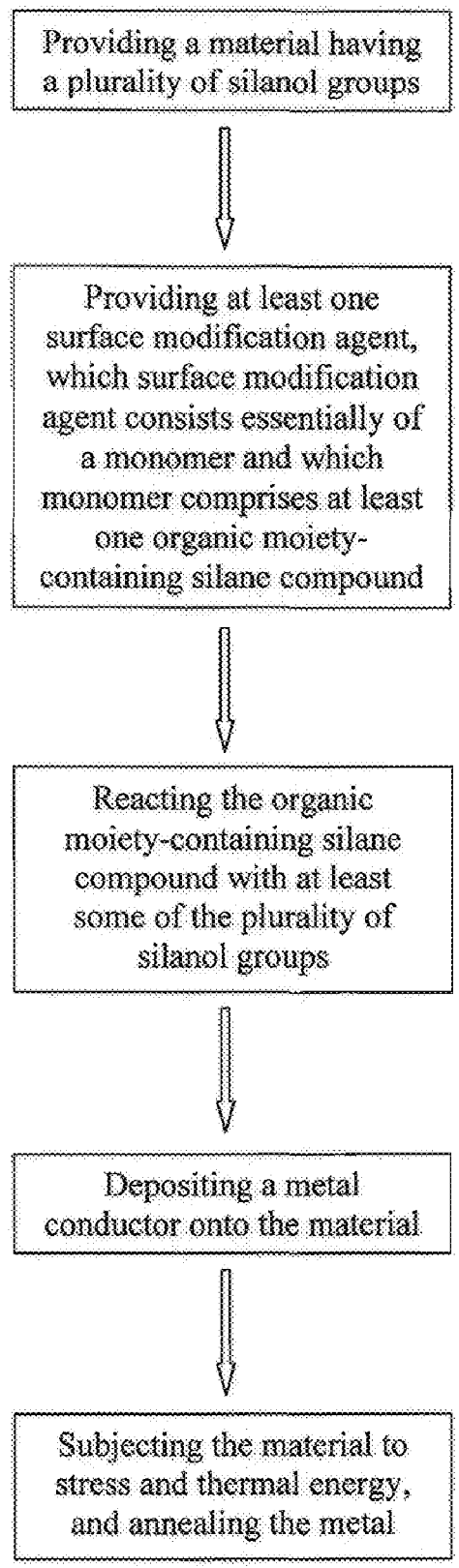
FIG. 1 is a flowchart illustrating a method of modifying the surface of a material in one illustrative embodiment with a surface modification agent.

Methods have been developed and are described herein that a) identifies potential causes of voiding; b) along with described compositions, repairs identified voiding or "pre-voiding" and c) utilizes conventional compositions and methods that do not increase the cost or complexity of the semiconductor production process that taken alone or in combination advance the production of layered materials, electronic components and semiconductor components. Specifically, the subject matter described herein provides methods of repairing voids in inorganic materials that comprise the steps of a) chemically capping reactive silanol groups in the inorganic materials with reactive surface modification agents, and b) minimizing condensation immediately following the ash step in-situ. The methods decribed herein are especially advantageous because they restore hydrophobicity and the structural integrity of the inorganic dense or porous film.

As used herein, the term "void" includes voids and cells in a material and any other term meaning space occupied by gas in the material. Gases that occupy these voids include relatively pure gases and mixtures thereof. Air, which is predominantly a mixture of $N_2$ and $O_2$ is commonly distributed in the pores, but pure gases such as nitrogen, helium, argon, $CO_2$ or CO are also contemplated.

Voiding causes include the etching step resulting in residual fluorine; the ashing step resulting in plasma damage, Si—F bond breaking, and silanol (Si—OH) bond formation due to the loss of terminal methyl or other alkyl groups (or other organic groups that make up the organosilicate glass); and the copper annealing step resulting in stress and thermal energy. The mechanism is believed to be attributable in large part to the porosity of the dielectric films. This porosity allows for greater transport of etchant gases (fluorocarbons and oxygen or a combination of nitrogen and hydrogen). The enhanced diffusion results in the gases etching not only the desired areas but also areas that are masked off, so that they are protected from etch. The primary manifestation of this etching is the removal of the organic capping group, such as methyl groups. The removal of these groups results in an unstable network (Si—$CH_3$→[Si]→Si—OH), which desires to end up in a Si—O—Si bond formation. The structural ramifications of this rearrangement are film shrinkage in unconstrained films. Since these films are constrained by the capping hard mask, as well as the metal conductor, the rearrangements in the confined system result in voids.

Methods of repairing voids in a material are described herein that include: a) providing a material having a plurality of reactive silanol groups; b) providing at least one reactive surface modification agent; and c) chemically capping at least some of the plurality of reactive silanol groups with the at least one of the reactive surface modification agents. Methods of carbon restoration in a material are also described that include: a) providing a carbon-deficient material having a plurality of reactive silanol groups; b) providing at least one reactive surface modification agent; and c)chemically capping at least some of the plurality of reactive silanol groups with the at least one of the reactive surface modification agents c) chemically capping at least some of the plurality of reactive silanol groups with the at least one of the reactive surface modification agents. A flowchart illustrating one method of modifying the surface of a material with a surface modification agent is provided in FIG. 1.

In addition, methods are described herein for reducing the condensation of a film that include: a) providing a film having a plurality of reactive silanol groups; b) placing the film into a plasma chamber; c) introducing a plurality of reactive organic moieties-containing silanes into the chamber; and d) allowing the silanes to react with at least some of the reactive silanol groups. Methods of reducing condensation of a carbon-deficient film are described herein that include:

a) providing a carbon-deficient film having a plurality of reactive silanol groups; b) placing the film into a plasma chamber; c) introducing a plurality of reactive organic moieties-containing silanes into the chamber; and d) allowing the silanes to react with at least some of the reactive silanol groups.

The materials, films and/or reactive surface modification agents may be provided by any suitable method, including a) buying at least some of the materials, films and/or reactive surface modification agents from a supplier; b) preparing or producing at least some of the materials, films and/or reactive surface modification agents in house using chemicals and/or other materials provided by another source and/or c) preparing or producing materials, films and/or reactive surface modification agents in house using chemicals and/or materials also produced or provided in house or at the location.

The methods described herein are useful for dense or porous dielectric materials. Contemplated dielectric materials are those that are considered as having a low dielectric constant. As used herein, the term "low dielectric constant" means those dielectric constants that are lower than or equal to about 3. It is contemplated that the value of the dielectric constant of a low dielectric constant material or layer is less than about 3. In another contemplated embodiment, the value of a low dielectric constant material or layer is less than about 2.5. In yet another contemplated embodiment, the value of a dielectric constant material or layer is less than about 2.

Contemplated inorganic-based compounds and/or materials and/or contemplated spin-on inorganic-based compounds and/or materials, such as silicon-based, gallium-based, germanium-based, arsenic-based, boron-based compounds or combinations thereof are contemplated herein. Examples of silicon-based compounds comprise siloxane compounds, such as methylsiloxane, methylsilsesquioxane, phenylsiloxane, phenylsilsesquioxane, methylphenylsiloxane, methylphenylsilsesquioxane, silazane polymers, dimethylsiloxane, diphenylsiloxane, methylphenylsiloxane, silicate polymers, silsilic acid derivaties, and mixtures thereof. A contemplated silazane polymer is perhydrosilazane, which has a "transparent" polymer backbone where chromophores can be attached.

As used herein, inorganic-based materials, inorganic compounds and spin-on-glass materials also include siloxane polymers and blockpolymers, hydrogensiloxane polymers of the general formula $(H_{0-1.0}SiO_{1.5-2.0})_x$, hydrogensilsesquioxane polymers, which have the formula $(HSiO_{1.5})_x$, where x is greater than about four and derivatives of silsilic acid. Also included are copolymers of hydrogensilsesquioxane and an alkoxyhydridosiloxane or hydroxyhydridosiloxane. Materials contemplated herein additionally include organosiloxane polymers, acrylic siloxane polymers, silsesquioxane-based polymers, derivatives of silsilic acid, organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl. Some useful organohydridosiloxane polymers have the sum of n and m from about four to about 5000 where R is a $C_1$-$C_{20}$ alkyl group or a $C_6$-$C_{12}$ aryl group. The organohydridosiloxane and organohydridosilsesquioxane polymers are alternatively denoted spin-on-polymers. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsequioxanes, phenylhydridosilsesquioxanes, and combinations thereof.

As used herein, the phrases "spin-on material" "spin-on composition" and "spin-on inorganic composition" may be used interchangeable and refer to those solutions and compositions that can be spun-on to a substrate or surface. It is further contemplated that the phrase "spin-on-glass materials" refers to a subset of "spin-on inorganic materials" in that spin-on glass materials refer to those spin-on materials that comprise silicon-based compounds and/or polymers in whole or in part.

In some contemplated embodiments, specific organohydridosiloxane resins utilized herein have the following general formulas:

$$[H-SiO_{1.5}]_n[R-SiO_{1.5}]_m \qquad \text{Formula (1)}$$

wherein:
the sum of n and m, or the sum or x, y and z is from about 8 to about 5000, and m or y is selected such that carbon containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups), and mixtures thereof; and wherein the specific mole percent of carbon containing substituents is a function of the ratio of the amounts of starting materials. In some LOSP embodiments, particularly favorable results are obtained with the mole percent of carbon containing substituents being in the range of between about 15 mole percent to about 25 mole percent. In some HOSP embodiments, favorable results are obtained with the mole percent of carbon containing substituents are in the range of between about 55 mole percent to about 75 mole percent.

Several contemplated polymers comprise a polymer backbone encompassing alternate silicon and oxygen atoms. In contrast with previously known organosiloxane resins, some of the polymers and inorganic-based compositions and materials utilized herein have essentially no hydroxyl or alkoxy groups bonded to backbone silicon atoms. Rather, each silicon atom, in addition to the aforementioned backbone oxygen atoms, is bonded only to hydrogen atoms and/or R groups as defined in Formula 1. By attaching only hydrogen and/or R groups directly to backbone silicon atoms in the polymer, unwanted chain lengthening and cross-linking is avoided. And given, among other things, that unwanted chain lengthening and cross-linking is avoided in the resins of the present invention, the shelf life of these resin solutions is enhanced as compared to previously known organosiloxane resins. Furthermore, since silicon-carbon bonds are less reactive than silicon hydrogen bonds, the shelf life of the organohydridosiloxane resin solutions described herein is enhanced as compared to previously known hydridosiloxane resins.

Some of the contemplated compounds previously mentioned are taught by commonly assigned U.S. Pat. No. 6,143,855 and pending U.S. Ser. No. 10/078919 filed Feb. 19, 2002; Honeywell International Inc.'s commercially available HOSP®(product; nanoporous silica such as taught by commonly assigned U.S. Pat. No. 6,372,666; Honeywell International Inc.'s commercially available NANOGLASS®E product; organosilsesquioxanes taught by commonly assigned WO 01/29052; and fluorosilsesquioxanes taught by commonly assigned U.S. Pat. No. 6,440,550, incorporated herein in their entirety. Other contemplated compounds are described in the following issued patents and pending applications, which are herein incorporated by reference in their entirety: (PCT/US00/15772 filed Jun. 8, 2000; U.S. application Ser. No. 09/330248 filed Jun. 10, 1999; U.S. application Ser. No. 09/491166 filed Jun. 10, 1999; U.S Pat. No. 6,365,765 issued on Apr. 2, 2002; U.S. Pat. No. 6,268,457 issued on Jul. 31, 2001; U.S. application Ser. No. 10/001143 filed Nov. 10, 2001; U.S. application Ser. No. 09/491166 filed Jan. 26, 2000; PCT/US00/00523 filed Jan. 7, 1999; U.S. Pat. No. 6,177,199 issued Jan. 23, 2001; U.S. Pat. No. 6,358,559 issued Mar. 19, 2002; U.S. Pat. No. 6,218,020 issued Apr. 17, 2001; U.S. Pat. No. 6,361,820 issued Mar. 26, 2002; U.S. Pat. No. 6,218,497 issued Apr. 17, 2001; U.S. Pat. No. 6,359,099 issued Mar. 19, 2002; U.S. Pat. No. 6,143,855 issued Nov. 7, 2000; U.S. application Ser. No. 09/611528 filed Mar. 20, 1998; and U.S. application Ser. No. 60/043,261). Silica compounds contemplated herein are those compounds found in U.S Pat. Nos. 6,022,812; 6,037,275; 6,042,994; 6,048,804; 6,090,448; 6,126,733; 6,140,254; 6,204,202; 6,208,041; 6,318,124 and 6,319,855. Other contemplated inorganic materials include ASM's Aurora™ organosilicate glass or carbon-doped oxides; those compounds in U.S. Pat. Nos. 6,383,955, 6,500,773, 6,492,731 or 6,410,150; Japan Synthetic Rubber LKD® silsesquioxane product; organosilsesquioxane films taught by commonly assigned U.S. Pat. No. 6,472,076; porous SiOC; Applied Materials' porous BLACK DIAMOND® inorganic product, which contains Si—O, Si—C, C—H and Si—H bonds); and Novellus CORAL® inorganic product (contains Si—O, Si—C, C—H and Si—H bonds). The foregoing patents are all incorporated herein in their entirety.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

In some contemplated embodiments, the polymer backbone conformation is a cage configuration. Accordingly, there are only very low levels or reactive terminal moieties in the polymer resin given the cage conformation. A cage conformation of the polymer backbone also ensures that no unwanted chain lengthening polymerization will occur in solution, resulting in an extended shelf life. Each silicon atom of the polymer is bonded to at least three oxygen atoms. Moieties bonded to the polymer backbone include hydrogen and the organic groups described herein. As used herein, the term "backbone" refers to a contiguous chain of atoms or moieties forming a polymeric strand that are covalently bound such that removal of any of the atoms or moiety would result in interruption of the chain.

As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "blockpolymers" Monomers may belong to various chemical classes of molecules including organic, organometallic or inorganic molecules. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

In some contemplated embodiments, the molecular weight of the inorganic-based compound may be increased in order to change the solubility of the material. In turn, changing the solubility of the material helps to prevent voiding and increases the planarization ability of the material.

Layers of the previously-mentioned inorganic materials, alone or in combination, may be formed by solution techniques, such as spraying, rolling, dipping, spin-coating, flow coating or casting with spin coating being preferred for microelectronics. In contemplated embodiments, the inorganic materials are dissolved in a solvent. Contemplated solvents include any suitable pure or mixture of organic, inorganic and/or organometallic molecules that are volatilized at a desired temperature, such as the critical temperature, or that can facilitate any of the above-mentioned design goals or needs. The solvent may also comprise any suitable pure or mixture of polar and non-polar compounds. As used herein, the term "pure" means that component that has a constant composition. For example, pure water is composed solely of $H_2O$. As used herein, the term "mixture" means that component that is not pure, including salt water. As used herein, the term "polar" means that characteristic of a molecule or compound that creates an unequal charge, partial charge or spontaneous charge distribution at one point of or along the molecule or compound. As used herein, the term "non-polar" means that characteristic of a molecule or compound that creates an equal charge, partial charge or spontaneous charge distribution at one point of or along the molecule or compound.

Some suitable solvents include aprotic solvents, for example, cyclic ketones, such as cyclopentanone, cyclohexanone, cycloheptanone and cyclooctanone; cyclic amides, such asN-alkylpyrrolidinone wherein the alkyl has from about 1 to 4 carbon atoms; and N-cyclohexylpyrrolidinone and mixtures thereof. A wide variety of other organic solvents may be used herein insofar as they are able to effectively control the viscosity of the resulting solution as a coating solution. In other contemplated embodiments, the solvent or solvent mixture may comprise solvents, such as ketones, such as acetone, diethyl ketone, methyl ethyl ketone and the like, alcohols, esters, ethers and amines. In yet other contemplated embodiments, the solvent or solvent mixture may comprise a combination of any of the solvents mentioned herein.

Other suitable solvents include acetone, 2-propanol, ethanol, butanol, methanol, propylacetate, ethyl lactate, propylene glycol methyl ether acetate, and propylene glycol propyl ether, referred to commercially as Propasol-P, dibutyl ether, cyclic dimethylpolysiloxanes, butyrolactone, γ-butyrolactone, 2-heptanone, ethyl 3-ethyoxypropionate, polyethylene glycol [di]methyl ether, propylene glycol methyl ether actetate (PGMEA), and anisole. Dilutant solvents with high boiling points such as ethyl lactate and propylene glycol propyl ether have been found beneficial. It is believed high boiling point solvents decrease the probability of formation of bubble film defects. In contrast, lower boiling point solvents may become entrapped below a crosslinked top layer of a film and subsequently produce voids when driven off during a baking process step. Additional solvents useful in the invention include ethylene glycol dimethyl ether, alternatively termed glyme, anisole, dibutyl ether, dipropyl ether, propylene glycol methyl ether acetate, and pentanol.

In some contemplated embodiments, the solvent or solvent mixture (comprising at least two solvents) comprises those solvents that are considered part of the hydrocarbon family of solvents. Hydrocarbon solvents are those solvents that comprise carbon and hydrogen. It should be understood that a majority of hydrocarbon solvents are non-polar; however, there are a few hydrocarbon solvents that could be considered polar. Hydrocarbon solvents are generally broken down into three classes: aliphatic, cyclic and aromatic. Aliphatic hydrocarbon solvents may comprise both straight-chain compounds and compounds that are branched and possibly crosslinked, however, aliphatic hydrocarbon solvents are not considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together.

Contemplated hydrocarbon solvents include toluene, xylene, p-xylene, m-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosine, isobutylbenzene, methylnaphthalene, ethyltoluene, ligroine.

Particularly contemplated solvents include, but are not limited to, pentane, hexane, heptane, cyclohexane, benzene, toluene, xylene and mixtures or combinations thereof. Various facilitating measures such as stirring and/or heating may be used to aid in the dissolution.

A more contemplated solvent is cyclohexanone. Typically, layer thicknesses are between 0.1 to about 15 microns. As a dielectric interlayer for microelectronics, the layer thickness is generally less than about 2 microns. Dielectric materials are described herein that comprise: a) an inorganic material having a plurality of silicon atoms; and b) a plurality of organic moiety-containing silane compounds, wherein the silane compounds are coupled to the inorganic material through at least some of the silicon atoms. Dielectric materials are also described herein that comprise: a) a low-k dielectric material having a plurality of silicon atoms; and b) a plurality of organic moiety-containing silane compounds, wherein the silane compounds are coupled to the material through at least some of the silicon atoms.

The compositions described herein are applied to various substrates, as mentioned earlier, to form layered materials, layers used in semiconductor processing, or layers used in electronic components, depending on the specific fabrication process, typically by conventional spin-on deposition techniques. The inorganic materials disclosed herein may act as an interlayer dielectric and may be covered by other coatings, such as other dielectric ($SiO_2$) coatings, $SiO_2$ modified ceramic oxide layers, silicon containing coatings, silicon carbon containing coatings, silicon nitrogen containing coatings, silicon-nitrogen-carbon containing coatings, diamond-like carbon coatings, titanium nitride coatings, tantalum nitride coatings, tungsten nitride coatings, aluminum coatings, copper coatings, tantalum coatings, organosiloxane coatings, organosilicon glass coatings and fluorinated silicon glass coatings. Such multiplayer coatings are taught in U.S. Pat. No.: 4,973,526, which is incorporated herein by reference. And, as amply demonstrated, the present inorganic material may be readily formed as interlined dielectric layers between adjacent conductor paths on fabricated electronic or semiconductor substrates. The inorganic material may be used in desirable all spin-on stacked films as taught by Michael E. Thomas, "Spin-on Stacked Films for Low $k_{eff}$ Dielectrics" *Solid State Technology*(July 2001), incorporated herein by reference in its entirety.

Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimide. In more preferred embodiments, the substrate comprises a material common in the packaging and circuit board industries such as silicon, copper, glass, and another polymer.

Contemplated surface modification agents are any suitable organic moieties containing silanes that can be vaporized under relatively mild conditions (with or without the aid of a carrier gas) and react with silanol groups efficiently at the chamber conditions. In some embodiments, the surface modification agents comprise silanes, such as $(R_1)_xSi(R_2)_{4-x}$ where $R_1$ is alkyl having 1 to 3 carbon atoms, vinyl or aryl; $R_2$ is hydrogen, chlorine, acetoxy, methoxy, ethoxy and other acetoxy groups; and x is 1, 2 or 3.

The term "alkyl" is used herein to mean a branched or a straight-chain saturated hydrocarbon group or substituent of 1 to 24 carbon atoms (unless otherwise specified herein), such as methyl, ethyl, n-propyl, isopropyl, n-butyl, isobutyl, t-butyl, octyl, decyl, tetradecyl, hexadecyl, eicosyl, tetracosyl and the like. In some embodiments, contemplated alkyl groups contain 1 to 12 carbon atoms. The term "cyclic alkyl" means an alkyl compound whose structure is characterized by one or more closed rings. The cyclic alkyl may be mono-, bi-, tri- or polycyclic depending on the number of rings present in the compound.

The term "aryl" is used herein to mean a monocyclic aromatic species of 5 to 7 carbon atoms or a compound that is built with monocyclic aromatic species of 5 to 7 carbon atoms and is typically phenyl, naphthalyl, phenanthryl, anthracyl etc. Optionally, these groups are substituted with one to four, more preferably one to two alkyl, alkoxy, hydroxy, and/or nitro substituents.

The term "alkenyl" is used herein to mean a branched or a straight-chain hydrocarbon chain containing from 2 to 24 carbon atoms and at least one double bond. Preferred alkenyl groups herein contain 1 to 12 carbon atoms.

The term "alkoxy" is used herein to mean an alkyl group bound through a single, terminal ether linkage; that is, an alkoxy group may be defined as —OR wherein R is an alkyl group, as defined above.

Contemplated coating materials, coating solutions and films can be utilized are useful in the fabrication of a variety of electronic devices, micro-electronic devices, particularly semiconductor integrated circuits and various layered materials for electronic and semiconductor components, including hardmask layers, dielectric layers, etch stop layers and buried etch stop layers. These coating materials, coating solutions and films are quite compatible with other materials that might be used for layered materials and devices, such as adamantane-based compounds, diamantane-based compounds, silicon-core compounds, organic dielectrics, and nanoporous dielectrics. Compounds that are considerably compatible with the coating materials, coating solutions and films contemplated herein are disclosed in PCT Application PCT/US01/32569 filed Oct. 17, 2001; PCT Application PCT/US01/50812 filed Dec. 31, 2001; U.S. application Ser. No. 09/538276; U.S. application Ser. No. 09/544504; U.S. application Ser. No. 09/587851; U.S. Pat. Nos. 6,214,746; 6,171,687; 6,172,128; 6,156,812, U.S. application Ser. No. 60/350187 filed Jan. 15, 2002; and U.S. Ser. No. 60/347195 filed Jan. 8, 2002, which are all incorporated herein by reference in their entirety.

The compounds, coatings, films, materials and the like described herein may be used to become a part of, form part of or form an electronic component and/or semiconductor component. As used herein, the term "electronic component" also means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, capacitors, inductors, diodes, rectifiers and fuses.

The present compositions may also be used as interlayer dielectrics in an interconnect associated with a single integrated circuit ("IC") chip. An integrated circuit chip typically has on its surface a plurality of layers of the present compositions and multiple layers of metal conductors. It may also include regions of the inorganic composition between discrete metal conductors or regions of conductor in the same layer or level of an integrated circuit.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators.

Examples of semiconductor components are transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples are resistors, capacitors, diodes, and transistors. Integrated components are combinations of components that that can provide multiple electrical properties at one place in a circuit. Examples are integrated circuits in which multiple components and connecting traces are combined to perform multiple or complex functions such as logic.

EXAMPLES

Example 1

In application of the compositions described herein to IC's, a solution of the present composition is applied to a semiconductor wafer using conventional wet coating processes such as, for example, spin-coating; other well known coating techniques such as spray coating, flow coating or dip coating may be utilized in specific cases. As an example, a cyclohexanone solution of the present composition (prepared under ambient conditions and with strict adherence to a clean-handling protocol to prevent trace metal contamination in any conventional apparatus having a non-metallic lining) is coated onto a substrate having electrically conductive components fabricated therein and the coated substrate is then subjected to thermal processing.

Application of this composition to form a layer onto a planar or topographical surface or substrate may be carried out by using any conventional apparatus, including a spin-coater, because the compositions used herein have a controlled viscosity suitable for such a coater.

Evaporation of the solvent may be accomplished by any suitable method or apparatus, such as simple air drying during spin-coating, by exposure to an ambient environment or by heating on a hot plate up to about 350° C.

After application of the inorganic material to an electronic topographical substrate, the coated structure is subjected to a bake and cure thermal process at increasing temperatures ranging from about 50° C. up to about 450° C. to polymerize the coating. The curing temperature is at least about 300° C. because a lower temperature is insufficient to complete the reaction herein.

Generally, it is preferred that curing is carried out at temperatures of from about 375° C. to about 425° C. Curing may be carried out in a conventional curing chamber, such as an electronic furnace, a hot plate and the like and is generally performed in an inert (non-oxidizing) atmosphere (nitrogen) in the curing chamber. In addition to hot plate curing, the present compositions may also be cured by exposure to ultraviolet radiation, microwave radiation or electron beam radiation as taught by commonly assigned patent publication PCT/US96/08678 and U.S. Pat. Nos. 6,042,994; 6,080,526; 6,177,143 and 6,235,353, which are incorporated herein by reference in their entireties. Any non-oxidizing or reducing atmospheres (e.g. argon, helium, hydrogen and nitrogen processing gases) may be used in the practice of the present invention, if they are effective to conduct curing of the inorganic materials.

In one embodiment, the present methods involves after plasma etching/ashing, subjecting the carbon-depletion damaged inorganic film to carbon restoration by placing the film in a plasma chamber. Reactive organic moieties-containing silanes, as described herein, are then introduced with or without the aid of a carrier gas. By optimizing the process conditions, gases are allowed to diffuse into the film and react with residue silanol groups. After the free silanol groups are capped or blocked, further condensation is minimized by the lack of any reactive groups. By re-introducing carbon moieties, hydrophobicity and structural integrity of the low k films are also restored.

Thus, specific embodiments and applications of inorganic compositions and methods of void reparation have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claims:

1. A method of modifying the surface of a material, consisting essentially of:
   providing a material having a plurality of silanol groups;
   providing at least one surface modification agent, which surface modification agent consists essentially of a monomer and which monomer comprises at least one organic moiety-containing silane compound;
   reacting the organic moiety-containing silane compound with at least some of the plurality of silanol groups;
   depositing a metal conductor onto the material; and
   subjecting the material to stress and thermal energy, and annealing the metal.

2. The method of claim 1, wherein the surface modification agent monomer restores hydrophobicity to the material.

3. The method of claim 1, wherein the material comprises an inorganic material.

4. The method of claim 3, wherein the inorganic material comprises a silicon-based inorganic material.

5. The method of claim 1, wherein the organic moiety-containing silane compound comprises a compound having the formula:

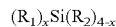

where $R_1$ is alkyl having 1 to 3 carbon atoms, vinyl or aryl; $R_2$ is hydrogen, chlorine, acetoxy, methoxy, ethoxy or other acetoxy groups; and x is 1, 2 or 3.

6. A method of carbon restoration in a carbon-depletion damaged material, comprising:
   providing a carbon-depletion damaged material having a plurality of silanol groups;
   providing at least one surface modification agent, which surface modification agent consists essentially of a monomer and which monomer comprises at least one organic moiety-containing silane compound;
   reacting the organic moiety-containing silane compound with at least some of the plurality of silanol groups;
   depositing a metal conductor onto the material; and subjecting the material to stress and thermal energy, and annealing the metal.

7. The method of claim 6, wherein the surface modification agent monomer restores hydrophobicity to the material.

8. The method of claim 6, wherein the carbon-depletion damaged material comprises an inorganic material.

9. The method of claim 8, wherein the inorganic material comprises a silicon-based inorganic material.

10. The method of claim 6, wherein the organic moiety-containing silane compound comprises a compound having the formula:

$$(R_1)_x Si(R_2)_{4-x}$$

where $R_1$ is alkyl having 1 to 3 carbon atoms, vinyl or aryl; $R_2$ is hydrogen, chlorine, acetoxy, methoxy, ethoxy or other acetoxy groups; and x is 1, 2 or 3.

11. A method of modifying the surface of a film, comprising:
providing a film having a plurality of silanol groups;
placing the film into a plasma chamber;
introducing at least one surface modification agent into the chamber in the form of a plasma, which surface modification agent consists essentially of a monomer and which monomer comprises at least one organic moiety-containing silane compound, wherein said organic moiety-containing silane compound reacts with at least some of the silanol groups;
depositing a metal conductor onto the film; and
subjecting the film to stress and thermal energy, and annealing the metal.

12. The method of claim 11, wherein the surface modification agent monomer restores hydrophobicity to the film.

13. The method of claim 11, wherein the film comprises an inorganic material.

14. The method of claim 13, wherein the inorganic material comprises a silicon-based inorganic material.

15. The method of claim 11, wherein the organic moiety-containing silane compound comprises a compound having the formula:

$$(R_1)_x Si(R_2)_{4-x}$$

where $R_1$ is alkyl having 1 to 3 carbon atoms, vinyl or aryl; $R_2$ is hydrogen, chlorine, acetoxy, methoxy, ethoxy or other acetoxy groups; and x is 1, 2 or 3.

16. A method of modifying the surface of a carbon-depletion damaged film, comprising:
providing a carbon-depletion damaged film having a plurality of silanol groups;
placing the film into a plasma chamber;
introducing at least one surface modification agent into the chamber, which surface modification agent consists essentially of a monomer and which monomer comprises at least one organic moiety containing silane compound;
reacting the organic moiety-containing silane compound with at least some of the silanol groups;
depositing a metal conductor onto the material; and
subjecting the film to stress and thermal energy, and annealing the metal.

17. The method of claim 16, wherein the surface modification agent monomer restores hydrophobicity to the film.

18. The method of claim 16, wherein the film comprises an inorganic material.

19. The method of claim 18, wherein the inorganic material comprises a silicon-based inorganic material.

20. The method of claim 16, wherein the organic moiety-containing silane compound comprises a compound having the formula:

$$(R_1)_x Si(R_2)_{4-x}$$

where $R_1$ is alkyl having 1 to 3 carbon atoms, vinyl or aryl; $R_2$ is hydrogen, chlorine, acetoxy, methoxy, ethoxy or other acetoxy groups; and x is 1, 2 or 3.

21. The method of claim 1 wherein the method prevents stress-induced voiding.

22. The method of claim 1 wherein the surface modification agent consists of a monomer which monomer consists essentially of an organic moiety-containing silane compound.

23. The method of claim 1, wherein the organic moiety-containing silane compound comprises an alkylacetoxysilane, an arylacetoxysilane and combinations thereof.

24. The method of claim 1, wherein the organic moiety-containing silane compound comprises tris(dimethylamino)methylsilane, tris(dimethylamino)phenylsilane, tris(dimethylamino)silane, methyltris(methylethylkeoxime)silane, methyltriacetoxysilane, dimethyldiacetoxysilane, phenyltriacetoxysilane, methyltrimethoxysilane, diphenyldiacetoxysilane and combinations thereof.

25. A material produced by the process of claim 1.

26. A material produced by the process of claim 6.

* * * * *